United States Patent [19]

Uetani et al.

[11] Patent Number: 5,374,742
[45] Date of Patent: Dec. 20, 1994

[54] POSITIVE RESIST COMPOSITION

[75] Inventors: Yasunori Uetani; Hirotoshi Nakanishi, both of Osaka, Japan

[73] Assignee: Sumitomo Chemical Company, Limited, Osaka, Japan

[21] Appl. No.: 148,346

[22] Filed: Nov. 8, 1993

Related U.S. Application Data

[62] Division of Ser. No. 743,299, Aug. 15, 1991, Pat. No. 5,290,657.

[30] Foreign Application Priority Data

Dec. 20, 1989 [JP] Japan ................... 1-331995
Dec. 20, 1990 [JP] Japan ................ PCT/JP90/01659

[51] Int. Cl.$^5$ ............................................ C07D 311/82
[52] U.S. Cl. ....................................... 549/223; 430/191
[58] Field of Search ..................... 549/388, 331, 223

[56] References Cited

U.S. PATENT DOCUMENTS

| | | | |
|---|---|---|---|
| 4,626,492 | 12/1986 | Eilbeck | 430/191 |
| 4,883,739 | 11/1989 | Sakaguchi et al. | 430/192 |
| 5,112,719 | 5/1992 | Yamada et al. | 430/191 |

FOREIGN PATENT DOCUMENTS

| | | |
|---|---|---|
| 0295465 | 12/1988 | European Pat. Off. . |
| 1289946 | 11/1989 | Japan . |
| 1289947 | 11/1989 | Japan . |

OTHER PUBLICATIONS

CA 116(6): 48934y.
"Condensation Products of Phenols and Ketones, Part XII. Studies with m-cresols, m-ethylphenol and 3,4-dimethylphenol" by Wilson Baker et al, Journal of the Chemical Society, Jul. 1957, pp. 3060-3064.

*Primary Examiner*—C. Warren Ivy
*Assistant Examiner*—A. A. Owens
*Attorney, Agent, or Firm*—Birch, Stewart, Kolasch & Birch

[57] ABSTRACT

A positive resist composition comprising an alkali-soluble resin, a quinone diazide compound and a specific hydroxyl group-containing compound can improve sensitivity without deterioration of heat resistance and film thickness retention.

5 Claims, 2 Drawing Sheets

POSITIVE RESIST COMPOSITION

FIELD OF THE INVENTION

This application is a divisional of copending application Ser. No. 07/743,299, filed on Aug. 15, 1991 now U.S. Pat. No. 5,290,657, the entire contents of which are hereby incorporated by reference.

The present invention relates to a radiation-sensitive positive resist composition which is excellent in sensitivity, heat resistance and film thickness retention.

BACKGROUND ART

A radiation-sensitive resist composition containing a compound having a quinone diazide group finds use as a positive resist, because upon exposure to light having a wavelength of not longer than 500 nm, the quinone diazide group decomposes to form a carboxyl group whereby the originally alkali-insoluble composition becomes alkali-soluble. The positive resist composition has much better resolution than a negative resist composition and is used in the production of integrated circuits such as IC or LSI.

Recently, particularly in the production of integrated circuits, miniaturization has proceeded as the integration level has increased, which results in demands for formation of patterns of submicron order. According to conventional processes for the production of integrated circuits, light exposure is accomplished by placing a mask in intimate contact to a substrate, e.g. a silicon wafer. It is said that this process cannot make patterns thinner than 2 μm. Instead of such conventional processes, the reduction projection in exposure system attracts attention. According to this new system, a pattern of a master mask (reticle) is projected on the substrate with reduction by a lens system, whereby exposure is accomplished. This system realizes a resolving power of submicron.

One of the serious problems in this system is low throughput. Namely, in this system, the total exposure time to expose a wafer is very long because of divided and repeated light exposure unlike a batch light exposure system which is employed in the conventional mask contact printing methods.

To solve this problem, not only an improvement in the apparatus but also an increase in sensitivity of the resist to be used are important.

To increase the sensitivity, it is easiest to decrease molecular weights of a quinone diazide compound and a novolak resin, in particular, a novolak resin used in the positive photoresist. The decrease of the alkali-soluble resin molecular weight accelerates dissolution of the photoresist in an alkaline developer so that the apparent sensitivity of the photoresist is increased.

This method, however, has very serious disadvantages such as large film thickness loss in an unexposed area (reduction of so-called film thickness retention), worsening a shape of the pattern, and decrease of the γvalue, namely decrease of resolution because of small difference in the dissolving rates in the developing solution between the exposed area and the unexposed area.

Other measures to increase the sensitivity of the resist are prolongation of a developing time and increase of an alkali concentration in a developing solution. By these measures, though the apparent sensitivity of the photoresist is increased because of increase of solubility of the resist in the developing solution, the film thickness retention is deteriorated, which results in decrease of resolution.

In general, it is impossible to improve the sensitivity with maintaining heat resistance and the film thickness retention, and vice versa.

OBJECTS OF THE INVENTION

An object of the present invention is to provide a positive resist composition which has better sensitivity without deterioration of heat resistance and film thickness retention.

DETAILED DESCRIPTION OF THE INVENTION

The present invention is based on the finding that, when a compound of the following general formula is present in a positive resist composition, the sensitivity can be much improved without deterioration of heat resistance and film thickness retention.

According to the present invention, there is provided a positive resist composition comprising an alkali-soluble resin, a quinone diazide compound as a radiation-sensitive component and a compound of the formula:

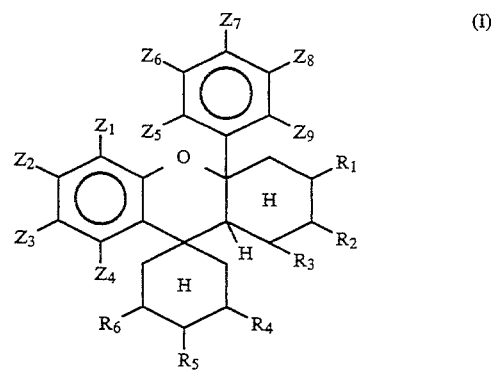

(I)

wherein $Z_1$ to $Z_9$ are independently a hydrogen atom, an alkyl group, a halogen atom or a hydroxyl group, provided that at least one of $Z_1$ to $Z_9$ is a hydroxyl group, and $R_1$ to $R_6$ are independently a hydrogen atom, an alkyl group, an alkenyl group, a cycloalkyl group or an aryl group.

As the alkyl group for $Z_1$ to $Z_9$, a $C_1$-$C_4$ alkyl group is preferred. As the alkyl group for $R_1$ to $R_6$, a $C_1$-$C_{10}$ alkyl group is preferred, and as the alkenyl group for $R_1$ to $R_6$, a $C_1$-$C_4$ alkenyl group is preferred.

The positive resist composition of the present invention will be explained in detail.

As the radiation-sensitive component, a quinone diazide compound is used. The quinone diazide compound is prepared by a conventional method, for example, by a condensation reaction of naphthoquinone diazide sulfonyl chloride or benzoquinone diazide sulfonyl chloride with a compound having a hydroxyl group in the presence of a weak alkali.

Examples of the compound having a hydroxyl group are hydroquinone, resorcinol, phloroglucin, 2,4-dihydroxybenzophenone, 2,3,4-trihydroxybenzophenone, tetrahydroxybenzophenones such as 2,3,3',4-tetrahydroxybenzophenone, 2,3,4,4'-tetrahydroxybenzophenone and 2,2',4,4'-tetra-hydroxybenzophenone, pentahydroxybenzophenones such as 2,3,3',4,4'-pentahydroxybenzophenone and 2,3,3',4,5'-penta-hydroxybenzophenone, alkyl gallates, and hydrofravan compounds such as a compound of the formula:

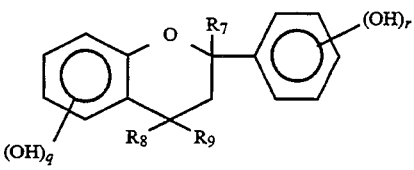

wherein q is a number of 0 to 4, r is a number of 1 to 5, $R_7$, $R_8$ and $R_9$ are respectively a hydrogen atom, an alkyl group, an alkenyl group, a cyclohexyl group or an aryl group.

Examples of the alkali-soluble resin are novolak resins prepared by reacting a phenol compound with an aldehyde such as formalin.

Examples of the phenol compound which is used as one of the raw materials of the novolak resin are phenol, cresol, xylenol, ethylphenol, trimethylphenol, propylphenol, methylbutylphenol, butylphenol, dihydroxybenzene, naphthols and so on. They may be used alone or as a mixture.

Among the phenol compounds, cresols are preferred. In this case, m-cresol alone may be used, although a mixture of m-cresol and p-cresol may be used. That is, cresols can be used in a ratio of m-cresol to p-cresol of from 100:0 to 30:70.

Examples of the formaldehyde which is used in the addition condensation reaction with the phenol compound are an aqueous solution of formaldehyde (formalin) and paraformaldehyde. In particular, 37% formalin which is commercially mass produced is suitably used.

The addition condensation reaction of the phenol compound and formaldehyde is carried out by a conventional method. The reaction is usually carried out at a temperature of 60 to 120° C. for 2 to 30 hours.

As a catalyst, any of conventionally used organic acids, inorganic acid and divalent metal salts can be used. Specific examples of the acid catalyst are oxalic acid, hydrochloric acid, sulfuric acid, perchloric acid, p-toluenesulfonic acid, trichloroacetic acid, phosphoric acid, formic acid, zinc acetate, magnesium acetate, etc.

The condensation reaction may be carried out in the presence or absence of a solvent.

A preferred molecular weight of the novolak resin varies with a mixing ratio of the phenol compound, the kind of catalyst and the reaction condition. Usually, the novolak resin having a weight average molecular weight (Mw) of 2000 to 50,000, preferably 3000 to 30,000 as measured by gel permeation chromatography (GPC) is preferably used.

In particular, when a molecular weight is measured by GPC with a UV light (254 nm) detector, more preferably the novolak resin shows an area ratio of a range in which the molecular weight calculated as polystyrene is not larger than 900 to the whole GPC pattern area of not exceeding 25%.

When said area ratio exceeds 25%, the heat resistance is deteriorated or a developing residue is produced.

The novolak resin characterized as above is obtained through fractionation and the like after the condensation reaction.

For example, the synthesized novolak resin is dissolved in a good solvent such as alcohols (e.g. methanol and ethanol), ketones (e.g. acetone, methyl ethyl ketone, methyl isobutyl ketone, etc.), ethylene glycol and its ethers or ether esters (e.g. ethylcellosolve, ethylcellosolve acetate, etc.), tetrahydrofuran and then precipitated. Alternatively, a synthesized novolak resin is poured in heptane, hexane, pentane, cyclohexane and the like to fractionate it.

Moreover, the novolak resin which is obtained by the above method preferably has a weight average molecular weight of 2000 to 20,000 as converted to polystyrene.

Specific examples of the compound (I) are

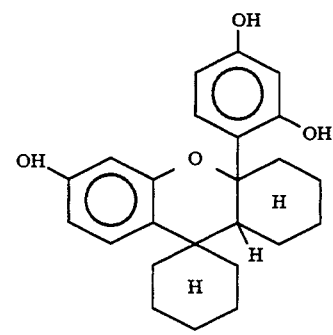

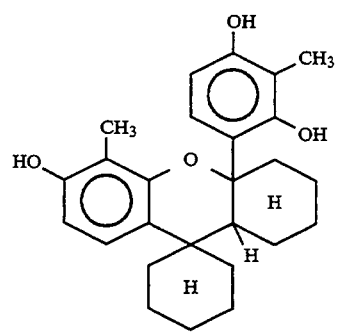

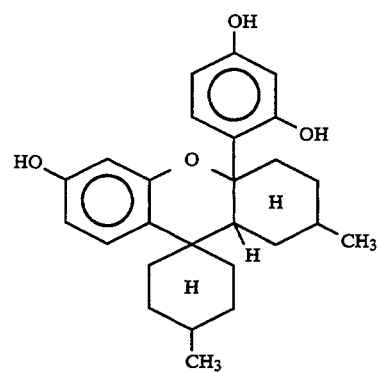

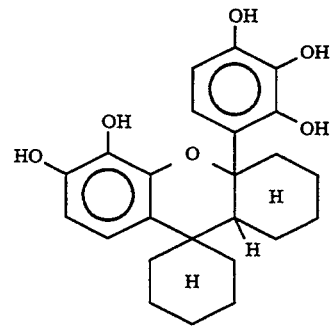

They may be used alone or as a mixture.

An amount of the compound (I) to be added to the resist composition is preferably from 5 to 20% by weight based on the total weight of the solid components in the resist composition.

The positive resist composition is prepared by mixing and dissolving the above quinone diazide compound, the alkali-soluble resin and the compound (I) in a solvent. A weight ratio of the alkali-soluble resin to the quinone diazide compound is preferably from 1:1 to 6:1.

Preferably, the used solvent evaporates at a suitable drying rate to give a uniform and smooth coating film. Examples of such solvent are ethylcellosolve acetate, methylcellosolve acetate, ethylcellosolve, methylcellosolve, propyleneglycol monomethyl ether acetate, butyl acetate, methyl isobutyl ketone, xylene, etc.

To the positive photoresist composition obtained by the foregoing method, small amounts of resins, dyes, etc. may be added if desired.

EFFECTS OF THE INVENTION

The resist composition of this invention has better sensitivity, heat resistance and film thickness retention.

EXAMPLES

The present invention will be illustrated more in detail with the following Examples, but it is not limited to these Examples. In Examples, "parts" are by weight unless otherwise indicated.

Synthetic Example 1

In a 500 ml four-necked flask, resorcinol (88 g), water (241.4 g) and 36% hydrochloric acid (22.6 g) were charged and heated to 50 to 55° C. to obtain a homogeneous solution. To the solution, cyclohexanone (19.6 g) was dropwise added over 60 minutes, and the mixture was stirred at 50 to 55° C. for 6 hours. After cooling to room temperature, a precipitated cake was recovered by filtration and washed with water (2 liters). The wet cake was dissolved in ethyl acetate (500 g) and washed with water (500 g) till an aqueous phase became neutral.

After separation, ethyl acetate was evaporated off under reduced pressure from the aqueous phase to obtain a residue (75.2 g). To the residue, toluene (75 g) was added and heated to 80° C. to form a homogeneous solution. After cooling to 25° C., the mixture was cooled with ice and kept at a temperature not higher than 5° C. for one hour, followed by filtration.

A wet cake was washed with toluene (30 g). The washed cake was added to toluene (48 g) and heated to 80° C. followed by stirring for one hour. Then, the mixture was cooled to 25° C. and filtrated. A cake was washed with toluene (30 g) and dried to obtain a white crystal compound (27.6 g) of the formula (II):

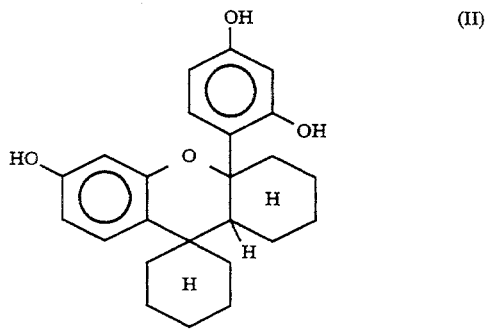

FDMS: 380. Melting point: 259°–261° C.

Synthetic Example 2

In a 500 ml four-necked flask, pyrogallol (113.4 g), water (195 g) and 36% hydrochloric acid (32.4 g) were charged and heated to 50° to 55° C. to obtain a homogeneous solution. To the solution, cyclohexanone (39.2 g) was dropwise added over 60 minutes, and the mixture was stirred at 50° to 55° C. for 8 hours. After cooling to room temperature, a precipitated cake was recovered by filtration and washed with water (2 liters). The wet cake was dissolved in ethyl acetate (500 g) and washed with water (500 g) till an aqueous phase became neutral.

After separation, ethyl acetate was evaporated off under reduced pressure from the aqueous phase to obtain a residue (99.9 g). To the residue, toluene (100 g) was added and heated to 80° C. to form a homogeneous solution. After cooling to 25° C., the mixture was cooled with ice and kept at a temperature not higher than 5° C. for one hour, followed by filtration.

A wet cake was washed with toluene (50 g). The washed cake was dissolved in ethyl acetate (40 g), added to toluene (115 g) and heated to 80° C. followed by stirring for one hour. Then, the mixture was cooled to 25° C. and filtrated. A cake was washed with toluene (50 g) and dried to obtain a white crystal compound (14.6 g) of the formula (III):

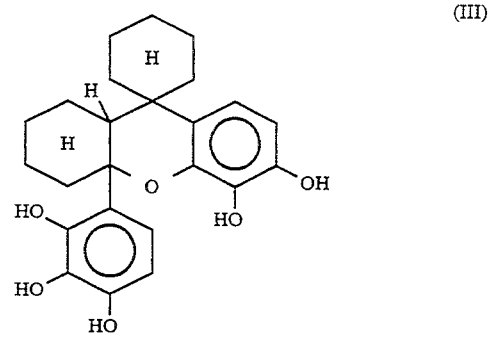

FDMS: 412. Melting point: 244°–246° C.

Examples 1–8 and Comparative Examples 1–3

Each of the compounds (II) and (III) was dissolved in ethylcellosolve acetate (48 parts) together with a novolak resin in a composition shown in Table 1 to prepare a resist solution.

Each composition was filtered through a Teflon (trademark) filter of 0.2 μm in pore size to obtain a resist solution. The solution was then coated on a silicon wafer, which had been rinsed in a usual manner, by means of a spinner to form a resist film of 1.3 μm in thickness. The coated silicon wafer was baked for 60 seconds on a hot plate kept at 100° C. and exposed to light having a wavelength of 436 nm (g line) while varying the exposure time stepwise by means of a reduction projection exposure apparatus (DSW 4800 with NA=0.28 manufactured by GCA). Thereafter, the silicon wafer was developed in a developer (SOPD (trade name) manufactured by Sumitomo Chemical Company, Limited) to obtain a positive pattern.

The remaining film thicknesses of the resist were plotted against the exposure time to calculate sensitivity. The film thickness retention was calculated from the remaining film thickness in the unexposed area. Also, the silicon wafer having a resist pattern was placed for 3 minutes on a direct hot plate set at various temperatures, and the heat resistance was evaluated by observing occurrence of thermal deformation of a line and space pattern of 3 μm by means of a scanning;electron microscope. The results are shown in Table 1.

TABLE 1

| Example No. | Resist composition | | | Resist properties | | |
|---|---|---|---|---|---|---|
| | Novolak*1) resin (parts) | Quinone diazide*2) compound (parts) | Compound (I) (parts) | Sensitivity*3) (msec) | Film thickness retention (%) | Heat resistance*4) (°C.) |
| 1 | A (17) | C (5) | II (2) | 160 | 95 | 130 |
| 2 | ↑ | ↑ | III (2) | 140 | 94 | 130 |
| C. 1 | ↑ | ↑ | — | 190 | 94 | 130 |
| 3 | B (17) | ↑ | II (3) | 140 | 95 | 130 |
| 4 | ↑ | ↑ | III (3) | 110 | 95 | 130 |
| C. 2 | ↑ | ↑ | — | 200 | 95 | 130 |
| 5 | ↑ | D (5) | II (4) | 130 | 98 | 140 |
| 6 | ↑ | ↑ | III (4) | 105 | 97 | 140 |
| C. 3 | ↑ | ↑ | — | 220 | 97 | 140 |
| 7 | ↑ | ↑ | II (6) | 80 | 96 | 120 |
| 8 | ↑ | ↑ | III (6) | 65 | 96 | 120 |

Note: *1)Novolak A:
A cresol mixture (the molar ratio of m-isomer to p-isomer = 7:3) was reacted with formalin (the molar ratio of the cresols to formalin = 1:0.8) were reacted in the presence of oxalic acid as a catalyst under reflax to obtain a novolak resin of 9800 in a weight average molecular weight calculated as polystyrene.
Novolak B:
A methacresol novolak resin which was prepared by reacting formalin and cresol in a ratio of 0.8:1 in the presence of oxalic acid as a catalyst and had an area ratio of a range in which the molecular weight as converted to polystyrene is not larger than 900 in the GPC patter being 18.3% and the weight average molecular weight of 10,020 calculated as polystyrene.
*2)Quinone diazide compound C:
A condensation product of naphthoquinone-(1,2)-diazide-(2)-5-sulfonl chloride and 2,3,4-trihydroxybenzophenone.
Quinone diazide compound D:
A condensation product of naphthoquinone-(1,2)-diazide-(2)-5-sulfonl chloride and 2,3,4,4'-tetrahydroxybenzophenone.
*3)A minimum exposure time (msec) at which the film thickness of the resist became zero.
*4)A temperature at which the line and space pattern of 3 μm started to thermally decompose.

Figure 1:
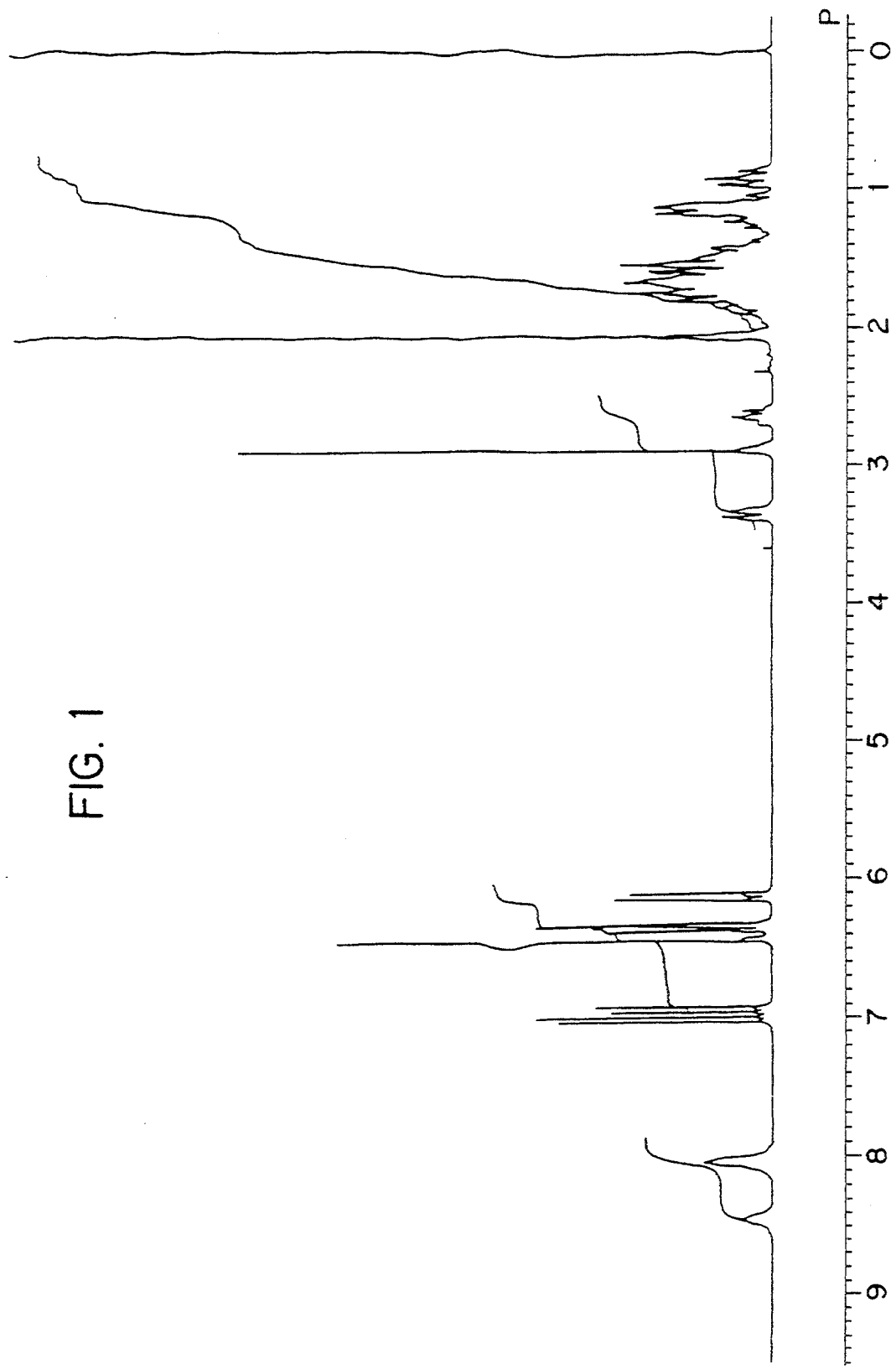
FIG. 1 is a $^1$H-NMR spectrum (solvent: acetone-$d_6$, TMS) of the compound prepared in Synthetic Example 1.
Figure 2:
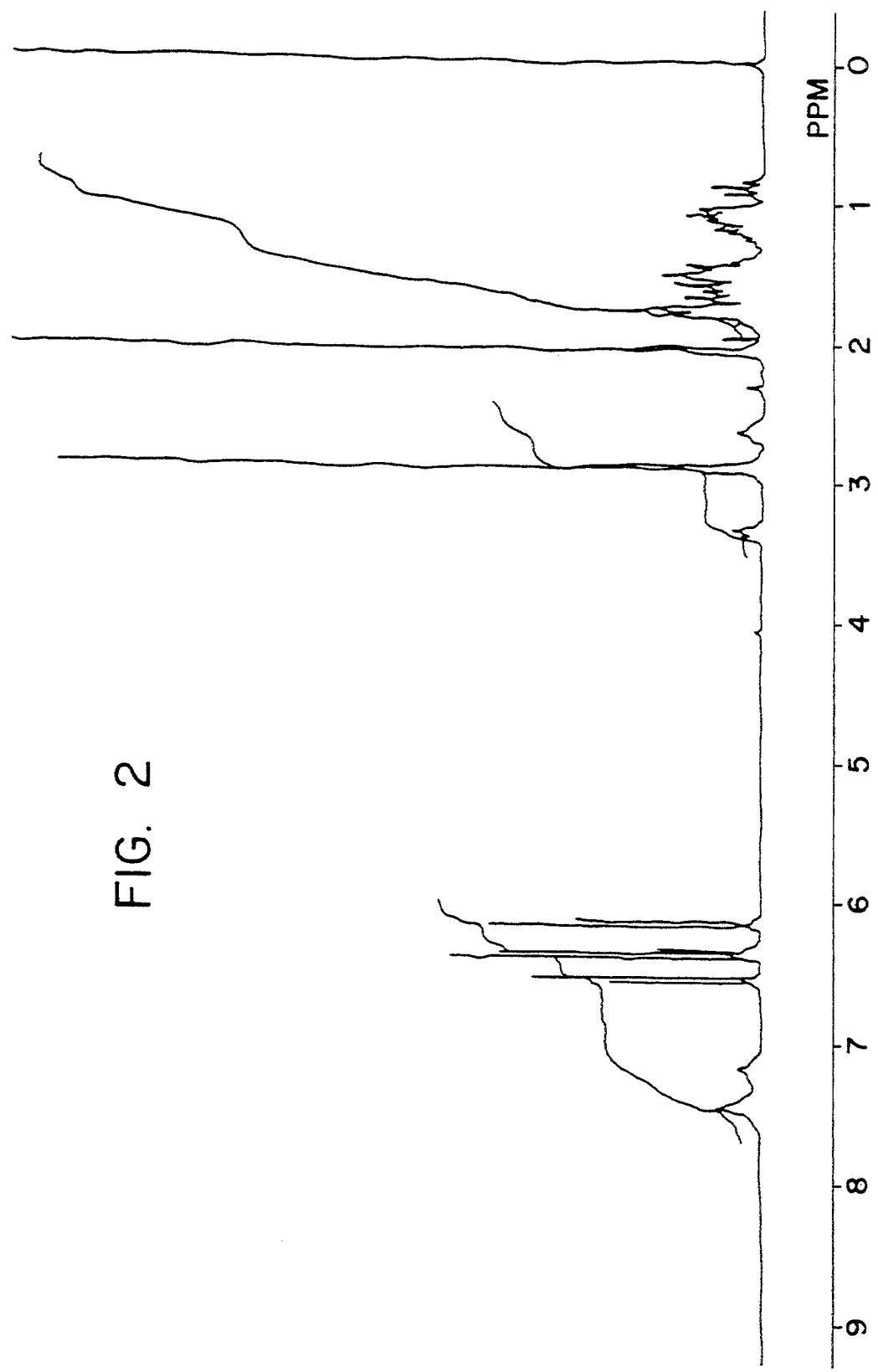
FIG. 2 is a $^1$H-NMR spectrum (solvent: acetone-$d_6$, TMS) of the compound prepared in Synthetic Example 2.

What is claimed is:

1. A compound of the formula

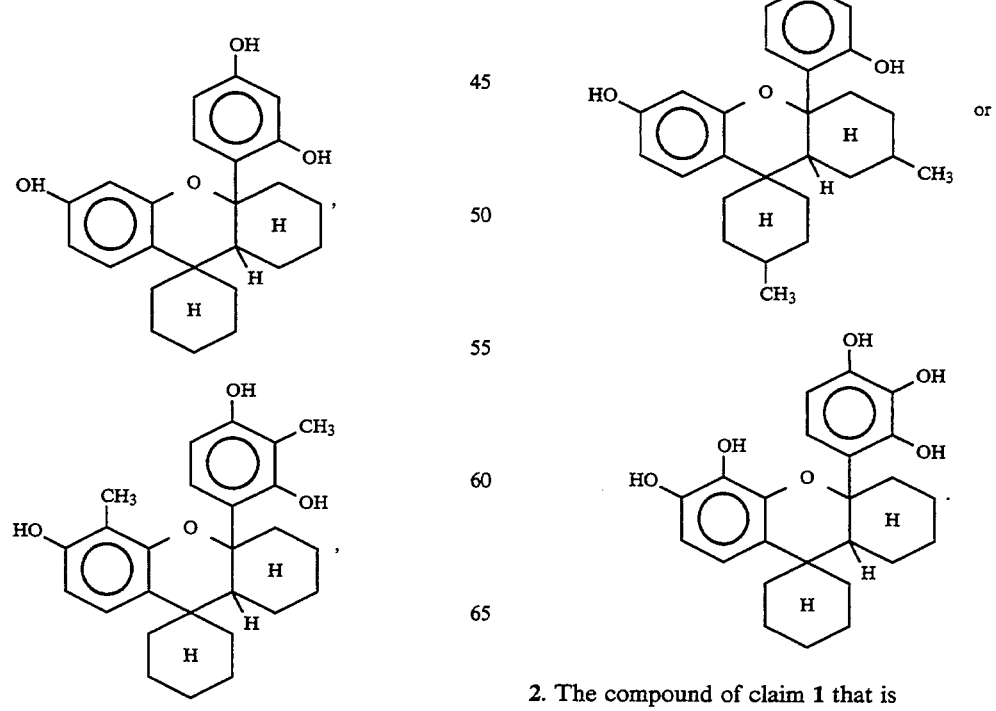

2. The compound of claim 1 that is

3. The compound of claim 1 that is
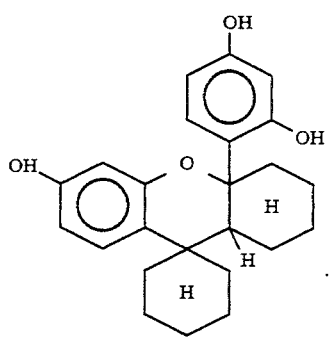
4. The compound of claim 1 that is
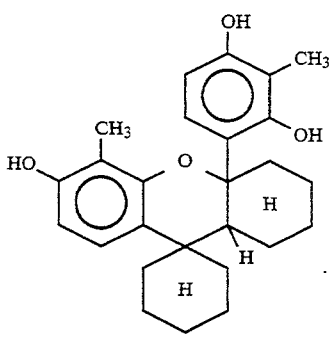
5. The compound of claim 1 that is
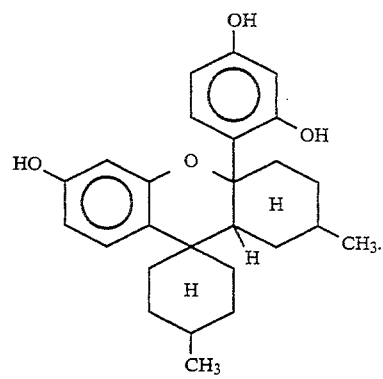
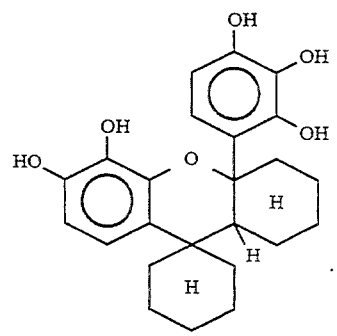
* * * * *